US011942860B2

(12) United States Patent
Routledge

(10) Patent No.: US 11,942,860 B2
(45) Date of Patent: Mar. 26, 2024

(54) DYNAMIC DIVISION RATIO CHARGE PUMP SWITCHING

(71) Applicant: pSemi Corporation, San Diego, CA (US)

(72) Inventor: Antony Christopher Routledge, Basingstoke (GB)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 17/331,594

(22) Filed: May 26, 2021

(65) Prior Publication Data

US 2022/0385178 A1   Dec. 1, 2022

(51) Int. Cl.
*H02M 3/07* (2006.01)
*H02M 1/08* (2006.01)
*H03K 17/687* (2006.01)

(52) U.S. Cl.
CPC ............... *H02M 3/07* (2013.01); *H02M 1/08* (2013.01); *H03K 17/687* (2013.01)

(58) Field of Classification Search
CPC ......... H02M 3/07; H02M 1/08; H03K 17/687
See application file for complete search history.

(56) References Cited

U.S. PATENT DOCUMENTS

| 4,972,097 | A | 11/1990 | You |
| 8,049,551 | B2 | 11/2011 | Kotowski et al. |
| 9,203,299 | B2 | 12/2015 | Low et al. |
| 10,263,514 | B1 | 4/2019 | Aboueldahab |
| 10,680,512 | B2 | 6/2020 | Babazadeh et al. |
| 10,749,429 | B2 | 8/2020 | Harvey |

(Continued)

FOREIGN PATENT DOCUMENTS

CN          101976555 B  *  2/2013

OTHER PUBLICATIONS

Nguyen, Long T., Office Action received from the USPTO dated Sep. 14, 2023 for U.S. Appl. No. 17/959,904, 13 pgs.

(Continued)

*Primary Examiner* — Metasebia T Retebo
(74) *Attorney, Agent, or Firm* — JAQUEZ LAND GREENHAUS & McFARLAND LLP; John Land, Esq.

(57) ABSTRACT

Circuits and methods to mitigate or eliminate potentially damaging events (e.g., damaging current spikes from in-rush current, charge transfer current, short circuits, etc.) in DC-DC power converters. Embodiments enable dynamic switching of conversion ratios in reconfigurable power converters while under load without turning off the power converter circuitry or suspending switching of the charge pump power switches. Embodiments selectively increase the ON resistance, $R_{ON}$, for at least some power FETs in a power converter by actively controlling the driver voltage to the gates of the power FETs. During normal operation, the power FET driver voltage may be set to overdrive the FET gate to lower $R_{ON}$ to a desired level that allows high current flow. For other scenarios, the power FET driver voltage may be reduced so as to increase $R_{ON}$ while ON and thus impede current flow to provide protection against potentially damaging events.

13 Claims, 7 Drawing Sheets

(56) References Cited

U.S. PATENT DOCUMENTS

| | | |
|---|---|---|
| 2007/0030749 A1 | 2/2007 | Pyeon |
| 2016/0149478 A1* | 5/2016 | Low .................. H02M 3/07 |
| | | 323/311 |
| 2018/0269789 A1* | 9/2018 | Kondo ................ H02M 3/158 |
| 2019/0173464 A1 | 6/2019 | Lin |
| 2020/0144925 A1 | 5/2020 | Hashim |
| 2022/0385178 A1 | 12/2022 | Routledge |
| 2022/0393586 A1 | 12/2022 | Yamakoshi |
| 2023/0095105 A1 | 3/2023 | Brink |

OTHER PUBLICATIONS

Nguyen, Long T., Notice of Allowance received from the USPTO dated Oct. 4, 2023 for U.S. Appl. No. 17/959,904, 8 pgs.
Rivera-Perez, Carlos O., Office Action received from the USPTO dated Nov. 13, 2023 for U.S. Appl. No. 17/960,712, 37 pgs.

* cited by examiner

DYNAMIC DIVISION RATIO CHARGE PUMP SWITCHING

BACKGROUND

(1) Technical Field

This invention relates to electronic circuits, and more particularly to power converter circuits, including DC-DC converter circuits.

(2) Background

Many electronic products, particularly mobile computing and/or communication products and components (e.g., notebook computers, ultra-book computers, tablet devices, LCD and LED displays) require multiple voltage levels. For example, radio frequency (RF) transmitter power amplifiers may require relatively high voltages (e.g., 12V or more), whereas logic circuitry may require a low voltage level (e.g., 1-2V). Still other circuitry may require an intermediate voltage level (e.g., 5-10V).

Power converters are often used to generate a lower or higher voltage from a common power source, such as a battery. One type of power converter comprises a converter circuit (e.g., a charge pump based on a switch-capacitor network), control circuitry, and, in some embodiments, auxiliary circuitry such as bias voltage generator(s), a clock generator, a voltage regulator, a voltage control circuit, etc. As used in this disclosure, the term "charge pump" refers to a switched-capacitor network configured to boost or buck $V_{IN}$ to $V_{OUT}$. Examples of such charge pumps include cascade multiplier, Dickson, Ladder, Series-Parallel, Fibonacci, and Doubler switched-capacitor networks, all of which may be configured as a multi-phase or a single-phase network. Switched-capacitor network DC-DC converters are generally integrated circuits (ICs) that may have some external components (such as capacitors) and in most cases are characterized as having a fixed $V_{IN}$ to $V_{OUT}$ conversion ratio (e.g., division by 2 or by 3). As is known in the art, an AC-DC power converter can be built up from a DC-DC power converter by, for example, first rectifying an AC input to a DC voltage and then applying the DC voltage to a DC-DC power converter.

To provide greater flexibility to system designers, and to deal with applications where a power source may change that requires different conversion ratios (e.g., as a battery discharges and outputs a lower voltage, or when the power source to a device is switched between a battery and an AC-DC power line source), it is useful to utilize a DC-DC power converter having a selectable conversion ratio. For example, U.S. Pat. No. 10,263,514 B1, issued Apr. 16, 2019, entitled "Selectable Conversion Ratio DC-DC Converter", assigned to the assignee of the present invention and hereby incorporated by this reference, describes a Dickson DC-DC power converter that may be switched between a divide-by-2 mode of operation and a divide-by-3 mode of operation. As another example, U.S. Pat. No. 9,203,299 B2, issued Dec. 1, 2015, entitled "Controller-Driven Reconfiguration of Switched-Capacitor Power Converter", now assigned to the assignee of the present invention and hereby incorporated by this reference, describes other DC-DC power converter architectures having reconfigurable conversion ratios.

FIG. 1 is a block diagram of one embodiment of a DC-DC selectable conversion ratio power converter 100. Operation is as described in U.S. Pat. No. 10,263,514 B1 patent (e.g., see FIG. 5 and accompanying text in particular). Non-overlapping complementary clock signals P1, P2 open or close associated power switches, causing charge to be transferred from the pump capacitors C1a, C1b, C2a, C2b (also known as "fly capacitors") into the $C_x$ capacitors, resulting in a voltage at node $V_{IN}/X$, where X=2 or 3.

The power switches shown in FIG. 1 are typically implemented as field-effect transistors (FETs), particularly MOSFETs, within an IC. In general, the FETs within a DC-DC power converter to which $V_{IN}$ is applied are relatively high voltage FETs (e.g., 10V-15V devices), while the remaining FETs are preferably smaller, lower voltage FETs (e.g., 3V-5V devices). For the sake of efficiency, the FETs preferably have a very low ON resistance, $R_{ON}$ (e.g., about 1-10 milliohms) to reduce resistive loss and resulting heat, although the switch ON resistance can vary considerably depending upon required efficiency and voltage. Note that if a FET switch is made too large to reduce $R_{ON}$, switching losses may start to decrease efficiency.

While the clock signals P1, P2 control the opening or closing of associated FET-based power switches, the control is not direct. Instead, the logic level voltages of the P1 and P2 clock signals (e.g., 0V="0", 5V="1") are level-shifted to a voltage range suitable for switching the state of a FET (e.g., $V_{GS} \leq 0V$ to switch the FET OFF, $V_{GS} > V_{TH}$ to switch the FET ON, where $V_{TH}$ is the threshold voltage of the FET). Note that the more $V_{GS}$ exceeds $V_{TH}$, the lower the ON resistance of the FET and accordingly the FETs in a power converter 100 are generally overdriven to near or at the maximum extent allowed for the FET in order to provide the lowest ON resistance. The level-shifted voltage is then coupled to the gate of the FET through a driver circuit. For example, FIG. 2 is a block diagram of a prior art gate control circuit 200 coupled to a charge pump power FET $M_{CP}$. A clock signal, P1 or P2, is applied to a level shifter circuit 202, which translates or shifts the applied signal to a voltage range suitable for switching the state of the power FET $M_{CP}$. The output of the level shifter circuit 202 is applied to the input of a buffer circuit 204, which increases the available current for low impedance inputs while retaining the voltage level. The output of the buffer circuit 204 is coupled to the gate of the charge pump power FET $M_{CP}$ (note that the drive voltage from the buffer circuit 204 may be provided through other components, not shown, such as a gate resistor or resistor network).

In the illustrated example, the clock signals, P1 or P2, are a voltage within a range from $V_{DD}$ (e.g., 5V) to circuit ground (0V). A low-voltage power supply 206 provides $V_{DD}$ to terminal $V_{DD1}$ of the level shifter 202, while circuit ground is coupled to terminal Gnd1. A high-voltage power supply 208 provides a voltage to terminal $V_{DD2}$ of the level shifter 202 equal to the over-driven ON-state $V_{GS}$ for the power FET $M_{CP}$ (e.g., 5V greater than the voltage at the source of the power FET $M_{CP}$). A second ground terminal Gnd2 is coupled to the source of the power FET $M_{CP}$. The high power voltage supply 208 is also coupled to the buffer circuit 204 at terminal $V_{DD3}$, and the ground terminal Gnd3 of the buffer circuit 204 is coupled to the source of the power FET $M_{CP}$.

A general problem with many FET-based DC-DC power converter architectures is that excessive current in-rush needs to be avoided during startup of the power converter. For example, absent sufficient guard circuitry, when $V_{IN}$ is first applied to a DC-DC power converter of the type shown in FIG. 1, none of the fly capacitors would be charged initially and accordingly current will rush into the circuit. For example, if the $R_{ON}$ of the FET power switches is 1 milliohm (0.001 ohms), and $V_{IN}$ is 10V, then as a result of Ohm's law, V=I×R, the in-rush current will be a spike of about 10,000 amps. In integrated circuit implementations, parasitic inductances exist (for example, due to on-die conductor routing and printed circuit board conductor routing) which transform a current spike to a voltage spike in accordance with inductor theory: V=L×dI/dt. Such voltage spikes electrically overstress the charge pump power switches, affecting their reliability, potentially to destruction. For a 1ns 100A pulse to generate 10V across the charge pump power switches, the parasitic inductance need only be about 100 pH. The resulting 10V spike may exceed the breakdown voltage of many of the FETs, and of course, a larger current spike will result in a larger voltage spike for the same parasitic inductance. A variety of added circuits have been used to provide a "soft start" mode of operation that controls in-rush current to a DC-DC power converter until the fly capacitors are sufficiently charged to allow the power switches to begin normal charge transfers.

A related problem occurs when the fly capacitors of a DC-DC power converter are out of balance, meaning that a charge difference exists between fly capacitors connected by power switches. If charge balance is not maintained, current spikes and resulting damaging voltage spikes can occur. A variety of added circuits have been used to provide charge rebalancing to avoid such spikes.

Accordingly, it would be useful to be able to mitigate or eliminate what may be characterized as "potentially damaging events" in power converters (e.g., damaging current spikes that may occur for a variety of reasons, including in-rush current, charge transfer current, short circuits, EMI events, and the like).

SUMMARY

The present invention provides circuits and methods that mitigate or eliminate potentially damaging events in power converters. Embodiments enable dynamic switching of conversion ratios in reconfigurable power converters while under load without turning off the power converter circuitry or suspending switching of the charge pump power switches. In addition, such circuits and methods have the added benefits of providing protection against potentially damaging events such as current spikes during a soft start for power converters and during dynamic charge balancing, without requiring added circuitry directed to those functions.

Embodiments of the present invention selectively increase the ON resistance, $R_{ON}$, for at least some of the power FETs in a power converter by actively controlling the driver voltage to the gates of the power FETs. During normal power converter operation, the power FET driver voltage may be set to overdrive the FET gate to lower $R_{ON}$ to a desired level that allows high current flow for a particular application. However, for other scenarios, the power FET driver voltage may be reduced so as to increase $R_{ON}$ and thus impede current flow to a desired level. Accordingly, the associated power FET $M_{CP}$ can be placed into (a) an overdriven ON state having low $R_{ON}$ for normal power converter operation, or (2) a reduced drive ON state having a higher $R_{ON}$ selected to provide protection against potentially damaging events (e.g., in-rush or charge transfer current), such as during dynamic re-configuration of the conversion ratio of the power converter, during power converter startup, when balancing charge among fly capacitors within the power converter, or during fault events such as short circuit events.

One embodiment encompasses a gate control circuit for regulating the ON resistance, $R_{ON}$, of a power FET, the gate control circuit being coupled to the gate of the power FET and configured to selectively apply at least a first voltage or a second voltage to the gate of the power FET such that the $R_{ON}$ of the power FET in an ON state is lower when the first voltage is applied and higher when the second voltage is applied.

Another embodiment encompasses a gate control circuit for controlling the ON resistance, $R_{ON}$, of a power FET in a power converter, the gate control circuit coupled to the gate of the power FET and configured to lower the $R_{ON}$ of the power FET in a first ON state during normal power converter operation and to raise the $R_{ON}$ of the power FET in a second ON state if a potentially damaging event occurs or is to occur.

Also encompassed by the present invention is a method of protecting a power converter, including controlling the ON resistance, $R_{ON}$, of at least one power FET in the power converter to lower the $R_{ON}$ of the at least one power FET in an ON state during normal power converter operation and to raise the $R_{ON}$ of the at least one power FET in an ON state if a potentially damaging event occurs or is to occur.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
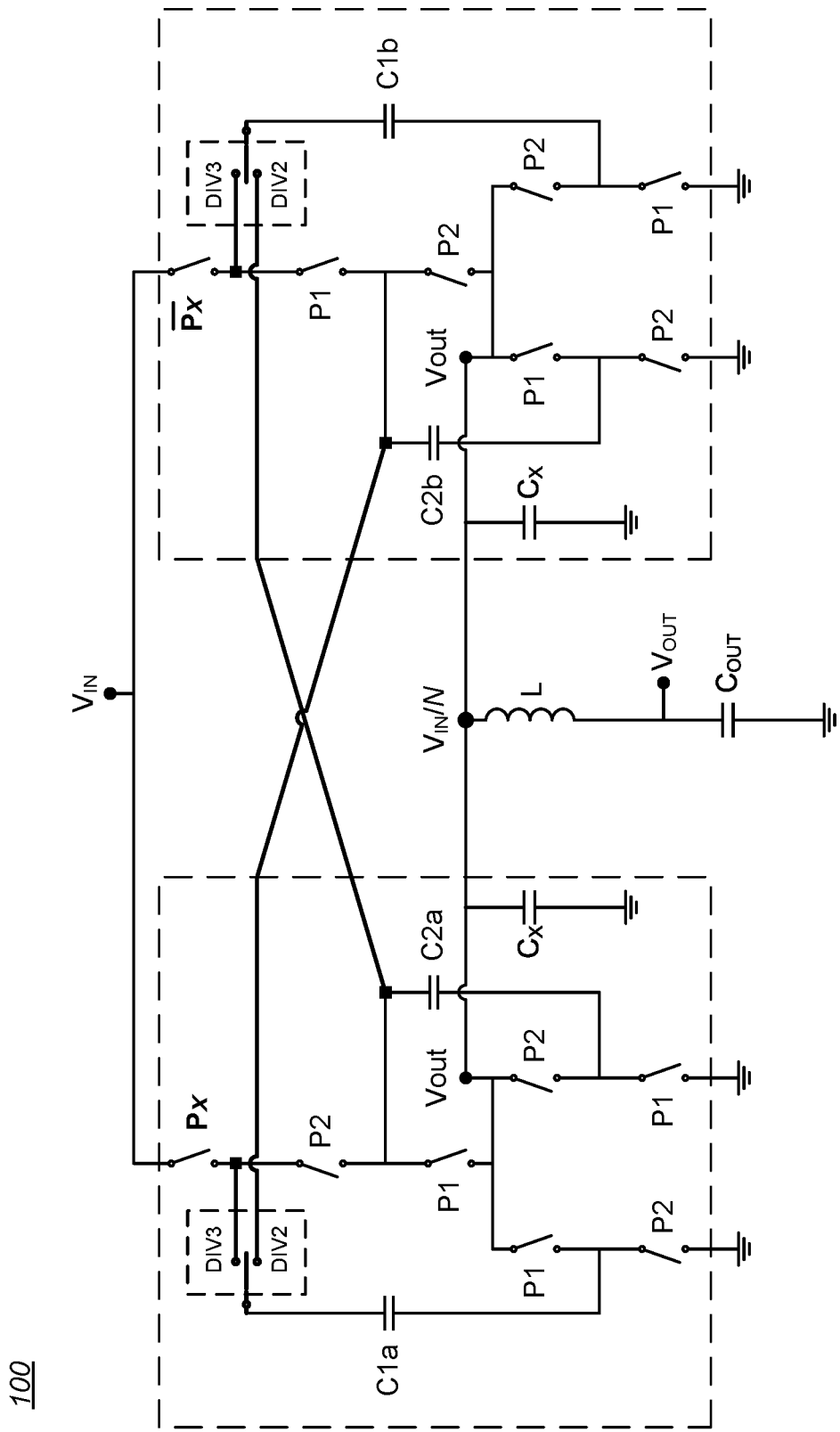
FIG. 1 is a block diagram of one embodiment of a DC-DC selectable conversion ratio power converter.

The present invention provides circuits and methods that mitigate or eliminate potentially damaging events in power converters. In addition, such circuits and methods have the added benefits of providing protection against potentially damaging events such as current spikes during a soft start for power converters and during dynamic charge balancing, without requiring added circuitry directed to those functions.

As noted above, damaging current spikes in power converters may occur for a variety of reasons, including in-rush current, charge transfer current, short circuits, and the like.

For example, with respect to DC-DC power converters having selectable conversion ratios, switching from one conversion ratio (e.g., divide-by-2, or "DIV2") to another conversion ratio (e.g., divide-by-3, or "DIV3") may result in a charge imbalance across the fly capacitors, resulting in potentially damaging in-rush currents. Accordingly, common practice for avoiding potentially damaging events has been to switch the DC-DC power converter OFF, allow the fly capacitors to discharge, change the conversion ratio configuration (e.g., by changing clock phasing to the charge pump FETs), and turn the power back ON, relying on conventional startup circuitry to mitigate in-rush current spikes. A disadvantage of this practice is that the process can take several milliseconds to complete and cannot be completed under load.

One aspect of the present invention encompasses circuits and method for mitigating or eliminating potentially damaging events if they occur or are to occur (e.g., are known in advance, as when a conversion ratio is to be dynamically changed). Mitigating or eliminating potentially damaging events enables switching selectable conversion ratios DC-DC power converters from one conversion ratio to another conversion ratio under load without turning off the power converter circuitry or suspending switching of the charge pump power switches.

Protection from Potentially Damaging Events

In analyzing the problem of limiting potentially damaging events in power converters, it was realized that power converter switches are normally operated in an "overdriven" condition when set to an ON (conducting) state. An overdriven FET gate creates a stronger conduction channel, effectively lowering the ON resistance, $R_{ON}$, of the FET. With that insight, it was further realized that increasing $R_{ON}$ for the power FETs in a power converter during potentially damaging events (e.g., during startup or when dynamically re-configuring the conversion ratio of the power converter) would reduce current flow through the FETs and thus protect against excessive current spikes.

One way of increasing $R_{ON}$ for the power FETs in a power converter is to actively control the driver voltage to the gates of the power FETs. During normal power converter operation, the driver voltage may be set to overdrive the FET gate to lower $R_{ON}$ to a desired level that allows high current flow for a particular application. However, during potentially damaging events such as startup or a dynamic conversion ratio reconfiguration, the driver voltage may be reduced so as to increase $R_{ON}$ and thus impede current flow to a desired level.

Figure 3A:
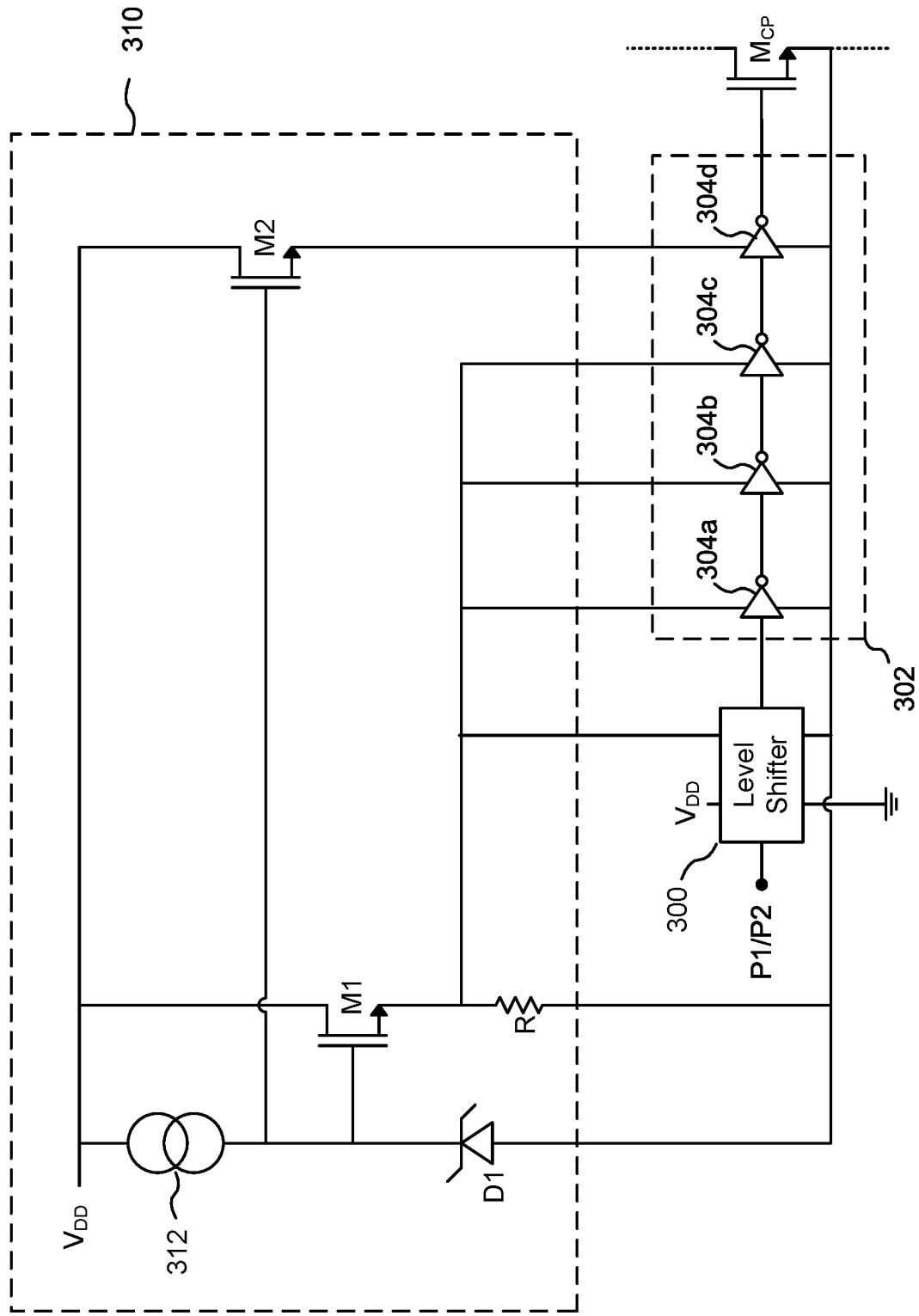
FIG. 3A is a schematic diagram of one embodiment of a gate control circuit coupled to a charge pump power FET.

FIG. 3A is a schematic diagram of one embodiment of a gate control circuit coupled to a charge pump power FET $M_{CP}$. For example, some of the FET switches shown in FIG. 1 may each be instances of FET $M_{CP}$.

The input to the gate control circuit, either clock signal P1 or clock signal P2, is applied a level shifter 300. As described in more detail above, the level shifter 300 translates the input signal from one voltage domain (e.g., digital logic voltages) to another voltage domain (transistor control voltages). The output of the level shifter 300 thus follows the input signal but in a different voltage range.

The output of the level shifter 300 is coupled to a driver circuit 302, the output of which is coupled to the gate of FET $M_{CP}$. In the illustrated example, driver circuit 302 is a set of four series-coupled inverters 304a-304d. In this particular embodiment, the inverters may increase in physical size from inverter 304a to inverter 304d in order to provide sufficient current drive capability to charge the gate of FET $M_{CP}$. For example, inverter 304a may have a relative size of "1", inverter 304b may be 3 times larger than inverter 304a, inverter 304c may be 9 times larger than inverter 304a, and inverter 304d may be 27 times larger than inverter 304a. In alternative embodiments, the number of inverter stages may be fewer or greater, and non-inverting stages (buffer amplifiers) may be used rather than inverting stages. Further, the multipliers for the stages may differ from the 1x, 3x, 9x, and 27x ratios shown, although generally each stage is larger than the previous one to avoid having very slow rising and falling edges. The illustrated driver circuit 302 is exemplary only, and other circuits may be used to couple the output of the level shifter 300 to the gate of FET $M_{CP}$.

Figure 2:
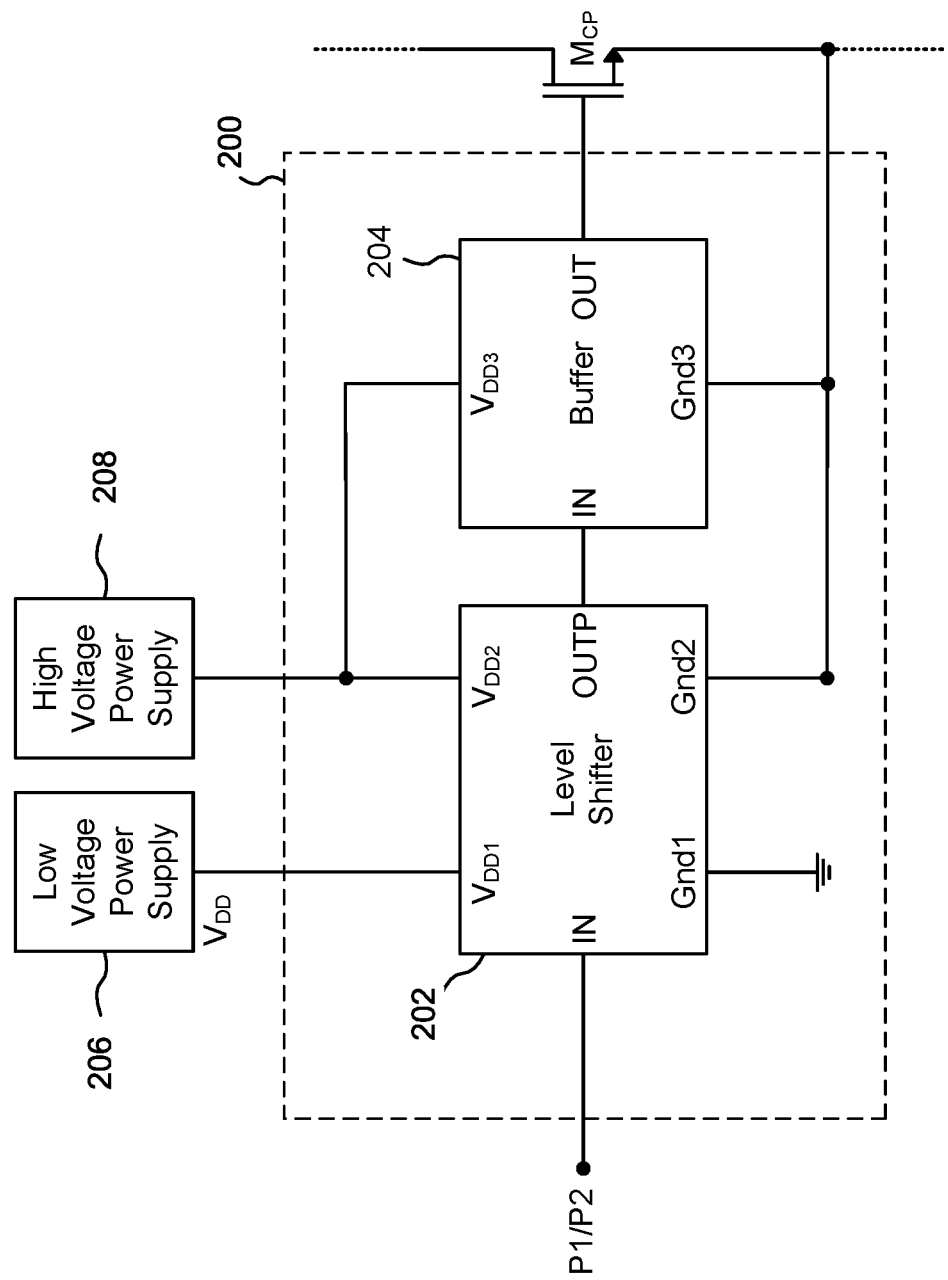
FIG. 2 is a block diagram of a prior art gate control circuit coupled to a charge pump power FET.

Power to the level shifter 300 (i.e., to the high voltage terminal $V_{DD2}$ shown in FIG. 2) and the driver circuit 302 is provided by a high-voltage power source 310. In the illustrated example, the power source for the level shifter 300 and the inverters 304a-304d of the driver circuit 302 is provided by a source follower (common drain) amplifier circuit that includes a regulated FET M1 having its conduction channel (drain to source) coupled in series with a resistor R between a supply voltage, $V_{DD}$, and circuit ground. As an example, the supply voltage $V_{DD}$ may be $V_{IN}$ to one phase of the charge pump that includes FET $M_{CP}$ or may be coupled to the voltage output from another phase of the charge pump—basically, any voltage than is sufficiently high and has sufficient drive strength for the circuit. A current source 312 is coupled in series between a Zener diode D1 between $V_{DD}$ and circuit ground. As is known in the art, a current source may be built from transistors and/or diodes using a variety of circuits. The output of the current source 312 before the Zener diode D1 provides an essentially constant bias voltage to the gate of FET M1. The bias current flows through the Zener diode D1 and ensures it is always in reverse bias.

As is known in the art, unlike a conventional diode that blocks any flow of current through itself when reverse biased, as soon as the reverse voltage reaches a pre-determined value, a Zener diode begins to conduct in the reverse direction. This applied reverse voltage remains almost constant even with large changes in current so long as the current remains between a breakdown minimum current and a maximum current rating for the Zener diode. A Zener diode will continue to regulate its voltage until the diode's holding current falls below the minimum current value in the reverse breakdown region.

The last inverter 304d is powered by a cascode FET M2 having its conduction channel (between drain and source) coupled between the supply voltage $V_{DD}$ and the inverter 304d. The output of the current source 312 before the Zener diode D1 provides an essentially constant bias voltage to the gate of FET M2; thus, FETs M1 and M2 have the same gate bias.

Figure 3B:
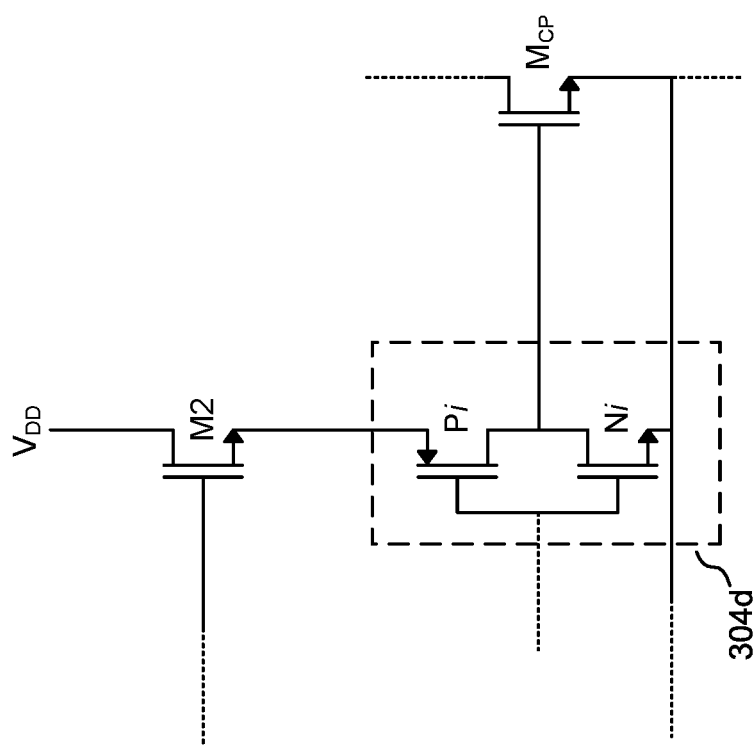
FIG. 3B is more detailed schematic diagram of one embodiment of FET M2 and a circuit for the last inverter of FIG. 3A.

FIG. 3B is more detailed schematic diagram of one embodiment of FET M2 and a circuit for the last inverter 304d of FIG. 3A. Internally, the inverter 304d has at least one NMOS fET Ni and one PMOS FET Pi with coupled conduction channels, drain-to-drain, with each FET Ni, Pi having a gate driven by inverter 304c. The source of the top-most PMOS FET Pi is coupled to the source of FET M2, and the source of the bottom-most NMOS FET Ni is coupled to the source of FET $M_{CP}$.

In the illustrated configuration, the power source 310 illustrated in FIG. 3A provides constant voltage to all of the inverters 304a-304d in the driver circuit 302. The current flow allowed through FET M2 sets the drive capability of the last inverter 304d, and hence of the driver circuit 302.

Figure 4:
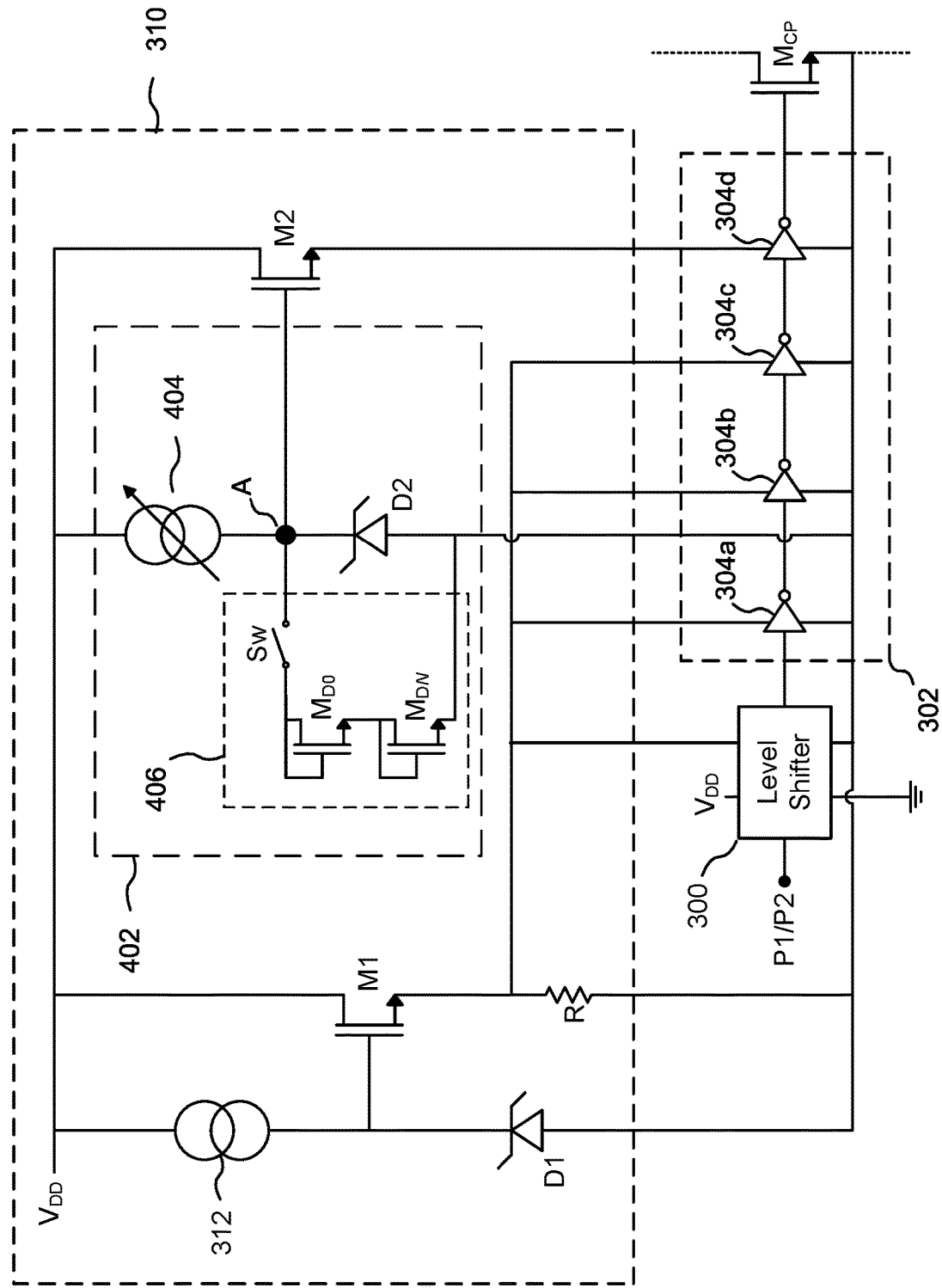
FIG. 4 is a schematic diagram of one embodiment of a novel gate control circuit in accordance with the present invention, shown coupled to a charge pump power FET.

FIG. 4 is a schematic diagram of one embodiment of a novel gate control circuit in accordance with the present invention, shown coupled to a charge pump power FET $M_{CP}$. Similar in many aspects to the gate control circuit of FIG. 3A, a key difference is that the gate of FET M2 is coupled to a separate gate driver circuit 402, and thus is independent of the gate driving circuitry for FET M1. The principal function of the gate driver circuit 402 is to enable at least two different voltage levels at Node A to be coupled to the gate of FET M2, which in turn determines the output voltage level provided by the last inverter 304d driving the associated power FET $M_{CP}$. Accordingly, the associated power FET $M_{CP}$ can be placed into (a) an overdriven ON state having low $R_{ON}$ for normal power converter operation, or (2) a reduced drive ON state having a higher $R_{ON}$ selected to provide protection against potentially damaging events (e.g., in-rush or charge transfer current), such as during dynamic re-configuration of the conversion ratio of the power converter, during power converter startup, when balancing charge among fly capacitors within the power converter, or during fault events such as short circuit events.

The gate driver circuit 402 includes an adjustable current source 404 coupled in series with a Zener diode D2 between $V_{DD}$ and circuit ground. The gate of FET M2 is coupled to Node A between the adjustable current source 404 and the Zener diode D2. The output of the adjustable current source 404 before the Zener diode D2 provides an essentially constant bias voltage to the gate of FET M2 for any specific setting of the adjustable current source 404. In parallel with the Zener diode D2 is a voltage control circuit 406 comprising a switch Sw series-coupled to a first diode-connected FET $M_{D0}$ and at least one additional diode-connected FET $M_{DN}$, where N≥1. As illustrated, one terminal of the switch Sw is coupled to the output of the adjustable current source 404 before the Zener diode D2 at Node A, and one terminal of the additional diode-connected FET $M_{DN}$ is coupled to the source of FET $M_{CP}$ (a "relative ground"). Note that the switch Sw may be positioned anywhere along the voltage control circuit 406 to interrupt or enable current flow through that circuit. For example, the order of switch Sw and FETs $M_{D0}$ and $M_{DN}$ from Node A to relative ground may be (1) Sw, $M_{D0}$, $M_{DN}$ (as illustrated), (2) $M_{D0}$, Sw, $M_{DN}$, or (3) $M_{D0}$, $M_{DN}$, Sw. However, positioning the switch Sw as shown in FIG. 4 may reduce parasitic influences on FET M2 due, for example, to the capacitances of FET $M_{D0}$ and/or FET $M_{DN}$.

A function of the diode-connected FET $M_{D0}$ is to offset FET M2, since the threshold voltages of FET $M_{D0}$ and FET M2 effectively cancel. A function of the additional diode-connected FETs $M_{DN}$ is to set the current through FET $M_{CP}$ in proportion to the ratio of the sizes of FET $M_{CP}$ to FET $M_{DN}$ when switch Sw is CLOSED and the current mirror function of the voltage control circuit 406 is engaged. More particularly, the current through FET $M_{CP}$ is proportional to the current from the current source 404 and the ratio of FET $M_{DN}$ to FET $M_{CP}$. For example, if the current source 404 output is 1 mA, and FET $M_{CP}$ is 1,000 times the size of FET $M_{DN}$ (W/L $M_{CP}$=1000×W/L $M_{DN}$), then the maximum current through FET $M_{CP}$ will be 1,000×1 mA=1A. This is achieved by ensuring the gate-to-source voltage of FET $M_{DN}$ is the same as that of FET $M_{CP}$. The maximum gate voltage of FET $M_{CP}$ is the voltage at Node A minus the threshold voltage $V_{TH}$ of FET M2. Hence including FET $M_{D0}$ increases the voltage at Node A by a threshold voltage, so the voltage at Node A=$V_{GS}$ of FET $M_{DN}$+$V_{TH}$ of FET $M_{D0}$. If FET M2 and FET $M_{D0}$ are matched (ratiometrically), then the maximum the $V_{GS}$ of FET $M_{CP}$ can reach is the same as the $V_{GS}$ of FET $M_{DN}$, and this equality will track over process, temperature, etc.

As noted, the diode-connected FET(s) $M_{DN}$ are ratioed in size with respect to FET $M_{CP}$. FETs M1, M2, $M_{D0}$, and $M_{CP}$ may be segmented FETs, meaning that a device intended to function as a large FET is fabricated as multiple (e.g., 10,000) small FETs coupled in parallel (the individual small FETs may be called "fingers", reflecting typical aspects of their physical layout on an IC die). The diode-connected FET(s) $M_{D0}$, $M_{DN}$ may be fabricated using the same technology, but can be made with a much smaller number of FET fingers (e.g., as few as one finger). Because of the cascode configuration of FET M2 and the last inverter 304d, a small change in current flow through the voltage control circuit 406 affecting the voltage at the gate of FET M2 causes a proportionally larger current flow through power FET $M_{CP}$ determined by the ratio of FET $M_{CP}$ to FET $M_{DN}$.

Adding more than one diode-connected FET $M_{DN}$ allows adjustment of the ratio of FET $M_{CP}$ to FET $M_{DN}$. For instance, if FET $M_{CP}$ has a width of 100 and 1,000 fingers, a first FET $M_{DN}$ should also have a width of 100 to match, but may only have 1 finger. Hence the ratio of FET $M_{DN}$ to FET $M_{CP}$ is 1,000 to 1, and 1 mA from the current source 404 means 1A through FET $M_{CP}$. To change the ratio to 2,000 to 1, two diode-connected FETs $M_{DN}$ may be coupled in series (source to drain). If the FET width is still 100, the effective number of fingers of the two diode-connected FETs $M_{DN}$ is one-half, giving a ratio of 2,000 to 1 with respect to FET $M_{CP}$.

As noted above, an important function of the gate driver circuit 402 is that it provides a selectable amount of regulated drive voltage to FET M2, which in turn controls the power supply to, and voltage output of, the last inverter 304d. When the switch Sw is OPEN, then the voltage control circuit 406 is disconnected from Node A—and therefore from the gate of FET M2—and thus has essentially no effect on the output of FET M2; accordingly, the last inverter 304d can overdrive the gate of FET $M_{CP}$ to a selected level determined by the Zener diode D2. In addition, when the switch Sw is OPEN, the current from the current source 404 may be selected to limit noise on FET M2. The fact that the current source 404 is selectable also allows for control of the maximum current through FET $M_{CP}$.

When the switch Sw is CLOSED— such as during startup of the power converter or when dynamically switching conversion ratios or rebalancing charge amount fly capacitors—then the voltage control circuit 406 operates as a bypass to divert current around diode D2 and lower the voltage at Node A, thus reducing the drive voltage to FET M2. The reduced gate drive voltage to FET M2 in turn reduces the power to the last inverter 304d and accordingly reduces the gate drive voltage to the power FET $M_{CP}$. Accordingly, FET $M_{CP}$ will have a reduced gate drive voltage that results in an increased $R_{ON}$ compared to the $R_{ON}$ when in a normal overdriven state. That increased resistance through at least some of the power FETs of a power converter will inhibit excessive current spikes, thus protecting the power FETs (as well as other coupled circuitry) from large voltage spikes.

In some embodiments, reduced-drive operation of a power FET in the ON state to limit current spikes during potentially damaging events may be enabled (triggered) by a control circuit (not shown) as a function of a measured parameter, such as the value of $V_{IN}$, $V_{OUT}$, pump capacitor voltages, or load current, and/or as the result of sensed events, such as short circuit events and/or charge imbalances on the pump capacitors. In some embodiments, reduced-drive operation of a power FET in the ON state to limit current spikes during potentially damaging events may be enabled (triggered) based on an external control signal for the switch Sw that is asserted in advance of a coming event, such as dynamic switching of conversion ratios.

The duration of reduced-drive operation for the power FETs may be set as a fixed time suitable for a particular application, or may be determined based on some criteria. For example, reduced-drive operation for the power FETs may be a function of output load, or a function of output load and a selected maximum duration (i.e., a time-out parameter), or a function of the voltage across the fly capacitors having reached some percentage (e.g., 95%) of a desired target level, or some combination of these and/or other parameters.

An advantage of using diode-connected FETs in the voltage control circuit 406 fabricated using the same technology as the power FET $M_{CP}$ (e.g., NMOSFET) is that the devices will essentially have matching characteristics with respect to process/voltage/temperature (PVT) variations.

As noted above, the principal function of the gate driver circuit 402 is to enable at least two different voltage levels at Node A to be coupled to the gate of FET M2. The principal function of the voltage control circuit 406 is to selectably shift the voltage at Node A between a first voltage level, in which the voltage control circuit 406 is not engaged (switch Sw is OPEN) and a second voltage level, in which the voltage control circuit 406 is engaged (switch Sw is CLOSED). It should be appreciated that while the gate driver circuit 402 and voltage control circuit 406 illustrated in FIG. 4 are preferred as simple to implement, requiring little power and circuit area, other devices or circuits that provide the same or similar function may be used in other embodiments. For example, Node A could be coupled through switch Sw to an amplifier having a level-shifted reference voltage as an input; the gate voltage to FET M2 would be more accurate but at the expense of complexity, circuit area, and power (and thus efficiency).

Figure 5:
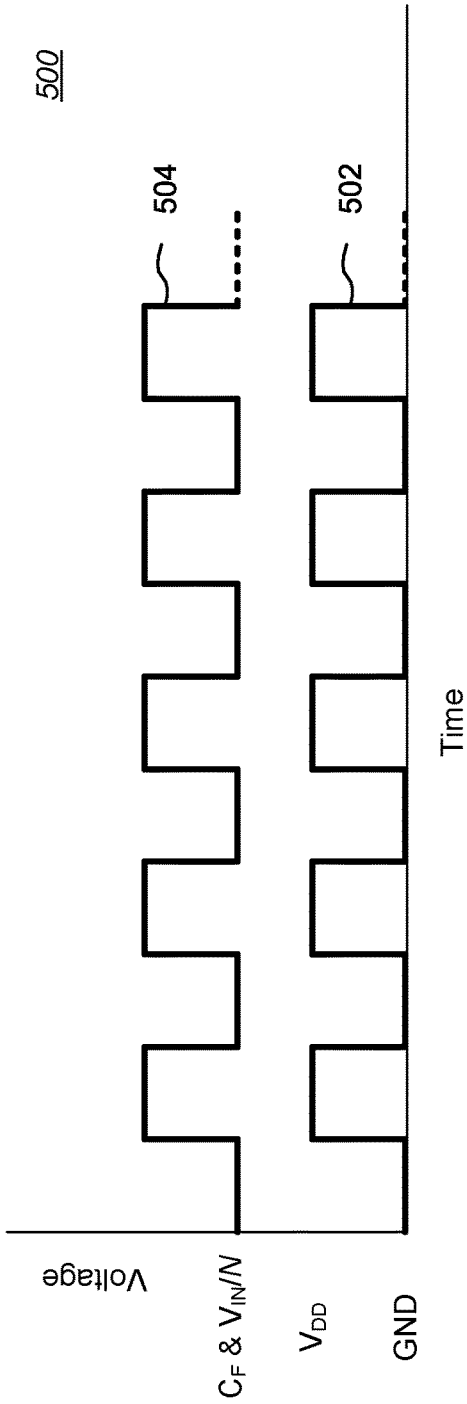
FIG. 5 is a timing diagram of various voltages as a function of time for a gate control circuit of the type shown in FIG. 3A used to switch power FETs in a power converter of the type shown in FIG. 1.

FIG. 5 is a timing diagram 500 of various voltages as a function of time for a gate control circuit of the type shown in FIG. 3A used to switch power FETs in a power converter of the type shown in FIG. 1. Graph line 502 shows transitions of the clock signal (P1 or P2, as applicable) applied to the level shifter 300 in FIG. 3A. Graph line 504 shows the resulting level-shifted voltage imposed across the fly capacitors (generically, $C_F$ and presented at the node $V_{IN}/N$.

Figure 6:
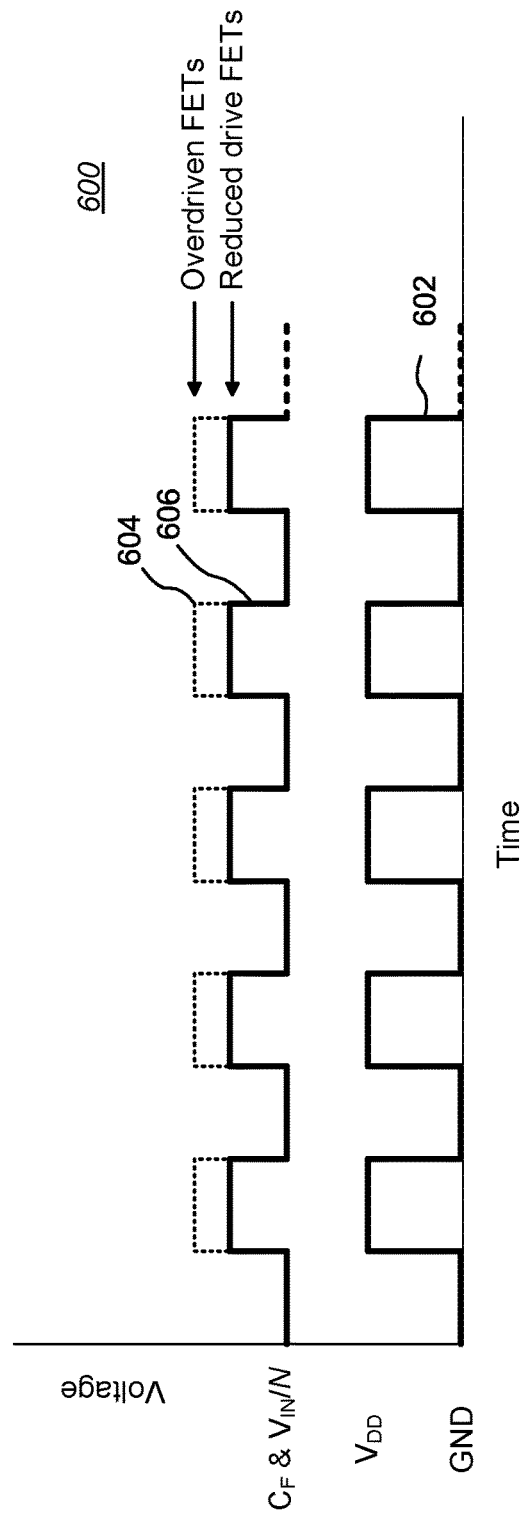
FIG. 6 is a timing diagram of various voltages as a function of time for a gate control circuit of the novel type shown in FIG. 4 used to switch power FETs in a power converter of the type shown in FIG. 1.

FIG. 6 is a timing diagram 600 of various voltages as a function of time for a gate control circuit of the novel type shown in FIG. 4 used to switch power FETs in a power converter of the type shown in FIG. 1. Graph line 602 shows transitions of the clock signal (P1 or P2, as applicable) applied to the level shifter 300 in FIG. 4. Graph line 604 shows the resulting level-shifted voltage imposed across the fly capacitors $C_F$ and presented at the node $V_{IN}/N$ when the switch Sw of the voltage control circuit 406 is OPEN, resulting in overdriven power FETs (thus, graph lines 504 and 604 show the same thing). Graph line 606 shows the resulting reduced level-shifted voltage imposed across the fly capacitors $C_F$ and presented at the node $V_{IN}/N$ when the switch Sw of the voltage control circuit 406 is CLOSED, resulting in reduced gate drive to the power FETs. Of note, the timing patterns for the power converter remain unchanged during reduced gate drive events (e.g., startup of the power converter or when dynamically switching conversion ratios) compared to normal overdriven gate drive operation.

While FIG. 6 shows the effects of two levels of $R_{ON}$ for the power FETs, more than two levels may be used. For example, a second voltage control circuit may be coupled in parallel with the first voltage control circuit 406 shown in FIG. 4, allowing 4 levels of $R_{ON}$: (1) no bypass (i.e., full overdrive to the power FET $M_{CP}$), (2) only the first voltage control circuit activated, (3) only the second voltage control circuit activated, or (4) both the first and second voltage control circuits activated. Alternatively, the adjustable current source 404 may be switched between two or more output levels in conjunction with activating only a single voltage control circuit 406. As yet another option, one or more of a series stack of diode-connected FETs $M_{DN}$ may include an associated parallel bypass switch that allows a particular FET in the stack to be bypassed, thereby changing the stack height and thus the number of combinations of active diode-connected FETs $M_{DN}$. As should be clear, other variations may be used to allow setting multiple levels of $R_{ON}$ for the power FETs.

The ability to select among more than two levels of $R_{ON}$ for the power FETs may be useful, for example, because when $V_{OUT}$ rises under load, a natural output current limit is reached for the higher impedance charge pump. In such cases, it may be useful to step currents through Node A in the gate driver circuit 402 to slowly increase the gate voltage to the power FETs, thereby decreasing $R_{ON}$ and increasing current flow. For example, the gate driver circuit 402 may set the $R_{ON}$ of the power FETs to the highest resistance level for a first number of clock cycles (e.g., 10), then to a next lower resistance level for a second number of clock cycles (e.g., 15), and then to a next even lower resistance level for a third number of clock cycles (e.g., 12) or until some criteria has been achieved (e.g., the voltage across the fly capacitors has reached 95% of a desired target level), at which time the $R_{ON}$ of the power FETs may be set to the lowest highest resistance level and normal operation commenced. More or fewer $R_{ON}$ steppings may be used to fit the needs of a particular application.

When dynamically switching conversion ratios for a power converter, it is generally useful to switch only when $V_{IN}$ is in the range for both conversion ratios. For example, when switching between a DIV2 configuration and a DIV3 configuration, a controller for the power converter may constrain reconfiguration unless $V_{IN}$ is within a specific voltage range. For instance, if in a DIV3 mode with $V_{IN}$=15V, the output is 5V. If the configuration is then changed to a DIV2 mode, the output would be greater, at about 7.5V, which could damage some of the lower-voltage power switches in the power converter. Hence the need to ensure that devices are not damaged when dynamically switching conversion ratios. Further, in many embodiments, the bottom-most FETs (those coupled on one side to circuit ground) should be set to a non-conducting (OPEN) state. In addition, since the output voltages and current may be changing relatively rapidly when dynamically switch conversion ratios, it may be useful in some embodiments to disable or limit protection circuitry designed to change the operational behavior of the charge pump until the power converter circuitry reaches a steady-state.

In some embodiments of power converters, when changing from a higher $V_{OUT}$ level (e.g., a DIV2 configuration having a 5V output) to a lower $V_{OUT}$ level (e.g., a DIV3 configuration having a 3.3V output), the power converter may discharge the charge on $C_{OUT}$ back into the $V_{IN}$ node, which may not be desirable in some circumstances. If this is the case, then clocking (e.g., P1 and P2) to the power converter can simply be suspended until the load on the power converter pulls the output down to the required level, after which clocking can be resumed. Note that while no charge is pumped back into the input using this discharge approach, the power FETs should still be set to the high resistance mode (i.e., reduced driver voltage) since the power converter capacitors will be imbalanced. In other cases, a discharge circuit may be coupled to the $V_{OUT}$ terminal to actively discharge $V_{OUT}$ until some criteria is some criteria has been achieved (e.g., the voltage at the $V_{OUT}$ terminal has reached 95% of a desired target level).

Charge Pump Startup and Charge Re-Distribution

As noted above, in addition to controlling current spikes when dynamically switching conversion ratios, the capability of being able to select multiple $R_{ON}$ values for the power FETs in a power converter enables controlled current during startup (a "soft start"). Accordingly, embodiments of the present invention may be used in lieu of other protection circuitry for avoiding excessive in-rush current while pre-charging the fly capacitors at startup of the power converter, thus saving IC die area. This benefit applies whether or not the power converter is dynamically switchable between conversion ratios.

In addition, embodiments of the present invention may use the ability to select multiple $R_{ON}$ values for the power FETs while balancing charge across the fly capacitors and output capacitor(s) of a power converter. For example, if the voltage across any fly capacitor is detected to be less than a "trigger" level (e.g., less than about 95% of a desired target level), a control circuit (not shown) may close switch Sw in FIG. 4, thus reducing the gate drive to the power FETs and consequently increasing their $R_{ON}$ for some period of time and/or until some criteria is met (such as the voltage across the "low" fly capacitor reaching at least a specified percentage of the desired target level, which may be more than, for example, the trigger level for reduced gate drive so as to introduce some hysteresis to the circuit). The increased $R_{ON}$ of the power FETs prevents excessive rates of charge transfer (which is similar to excessive in-rush current on startup). After the passage of the set duration or the occurrence of the specified criteria, the switch Sw would be opened again, reducing the $R_{ON}$ of the power FETs for improved efficiency during normal operation. Importantly, the timing patterns for the power converter remain unchanged during such reduced gate drive events compared to normal overdriven gate drive operation. This protective current-limiting benefit applies whether or not the power converter is dynamically switchable between conversion ratios, and to other scenarios as well, like fault events such as an output short or over-current condition.

In general, it is highly advantageous to make sure that the power FET(s) to which $V_{IN}$ is coupled in a power converter—that is, the current-limiting or blocking FET(s) in the circuit—are configured to have higher resistances than other FETs in the circuit. Accordingly, it is generally useful to equip such "blocking" FETs with a gate control circuit like that shown in FIG. 4 and thus have multiple selectable $R_{ON}$ values, such that a high resistance (large $R_{ON}$) ON mode may be selected during startup (soft start), dynamic switching of conversion ratios, and failure modes. While in some embodiments preferring the highest resistance mode for such events or modes may be most beneficial, in other embodiments the level of $R_{ON}$ may be varied. For example, the resistance of $R_{ON}$ may be scaled based on $V_{IN}$—the higher the value of $V_{IN}$, the more resistance may be needed to keep current constant. Other parameters may be considered in setting the value of $R_{ON}$, such as $V_{OUT}$.

In addition, depending on the application, not all of the other power FETs in a power converter need be configured to have a selectable $R_{ON}$. Some general guidelines follow:

for power converters that can dynamically switch between conversion ratios, all power FETs devices connected to the inductor L and all mid-switch FETs (the switches between the switch coupled to $V_{IN}$ and the inductor L) should have a selectable $R_{ON}$ capability;

for charge balancing, all power FETs devices should have a selectable $R_{ON}$ capability, and the bottom-most FETs (those coupled on one side to circuit ground) should first be set to a conducting (CLOSED) state;

for other applications, it may be useful to analyze the needs of the application to decide which power FETs devices need have a selectable $R_{ON}$ capability.

It may be useful to provide embodiments of the gate driver circuit 402 shown in FIG. 4 for all power FETs in a power converter, but only enable the voltage control circuit 406 in some of the gate driver circuits 402 in a particular IC part (e.g., by using one-time programmable devices such as fuses). In the end, there is a design decision to increase resistance in certain current paths temporarily to help deal with temporary imbalances. How much resistance to add in a current path depends on how much current limiting is desired and how much power dissipation can be tolerated. Power dissipation can be limited if only some switches are put into a high resistance mode at any one time using reduced drive voltages, and/or if the reduced gate drive is stepped from lower levels (higher $R_{ON}$) to higher levels (lower $R_{ON}$).

If all of the power FETs in a power converter are controlled by the gate control circuitry shown in FIG. 4, an added benefit is that heat dissipation is fairly uniform across the entire power converter during increased $R_{ON}$ modes of operation.

It should be appreciated that the novel gate control circuit in FIG. 4 may be applied to control the $R_{ON}$ of an associated FET in applications other than power converters where the ability to selectively provide for a reduced-drive mode of operation may be beneficial.

Methods

Figure 7:
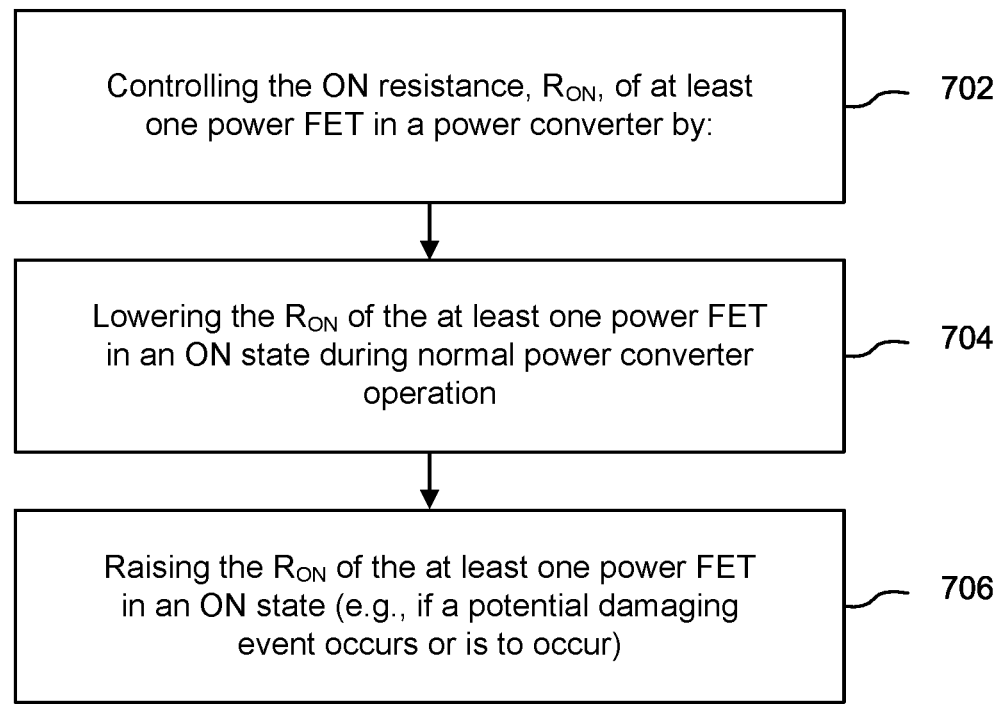
FIG. 7 is a process flow chart showing one method for protecting a power converter from potentially damaging events.

Another aspect of the invention includes methods of protecting a power converter from potentially damaging events, such as startup in-rush current events. For example, FIG. 7 is a process flow chart 700 showing one method for protecting a power converter from potentially damaging events. The method includes controlling the ON resistance, $R_{ON}$, of at least one power FET in the power converter (Block 702) by: lowering the $R_{ON}$ of the at least one power FET in an ON state during normal power converter operation (Block 704), and raising the $R_{ON}$ of the at least one power FET in an ON state (e.g., if a potentially damaging event occurs or is to occur) (Block 706).

Additional aspects of the above method may include one or more of the following: wherein the potentially damaging event may result from a dynamic re-configuration of a conversion ratio of the power converter; wherein the potentially damaging event may result from startup of the power converter; and/or wherein the potentially damaging event may result from charge rebalancing among two or more capacitors within the power converter.

Fabrication Technologies & Options

Another use of embodiments of the present invention is EMI control. For example, the ON resistance, $R_{ON}$, of at least one power FET that might be subjected to an EMI event may be increased every cycle for a first moment of time (e.g., one or a few micro-seconds) to protect the FET and coupled circuitry from such EMI events, and then the $R_{ON}$ may be lowered for the rest of the cycle.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Charge pumps in general, and more particularly charge pumps in accordance with the present invention, are particularly beneficial in many applications. For example, charge pumps can be more efficient in comparison to a regulated system and can provide fixed division/multiplication ratios. The ability to change the division/multiplication ratio in order to maintain a correct output voltage is especially useful for battery-operated applications, where changes in battery voltage (the input voltage to the charge pump) often occur, such as when fresh batteries are inserted or as battery voltage declines with use.

As another example, charge pumps may also be used in mobile devices and for connection systems. In the case of some connection systems, such as USB-C, currents are limited due to sizing of the wires, so to deliver a desired amount of power, the input voltage is increased. Charge pumps may be used to divide down the voltage as needed for various circuits or sub-circuits.

As yet another example, charge pumps may be used in computer servers. Input voltages may be, for instance, 12V or 48V (higher input voltages reduces $I^2*R$ losses in the system). A charge pump is useful to divide down the system input voltage to a lower point-of-load input voltage downstream, such as to a microprocessor.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

In various embodiments of power converters, it may be beneficial to use specific types of capacitors, particularly for the fly capacitors. For example, it is generally useful for such capacitors to have low equivalent series resistance (ESR), low DC bias degradation, high capacitance, and small volume. Low ESR is especially important for power converters that incorporate additional switches and fly capacitors to increase the number of voltage levels. Selection of a particular capacitor should made after consideration of specifications for power level, efficiency, size, etc. Various types of capacitor technologies may be used, including ceramic (including multi-layer ceramic capacitors), electrolytic capacitors, film capacitors (including power film capacitors), and IC-based capacitors. Capacitor dielectrics may vary as needed for particular applications, and may include dielectrics that are paraelectric, such as silicon dioxide ($SiO_2$), hafnium dioxide ($HFO_2$), or aluminum oxide $Al_2O_3$. In addition, power converter designs may beneficially utilize intrinsic parasitic capacitances (e.g., intrinsic to the power FETs) in conjunction with or in lieu of designed capacitors to reduce circuit size and/or increase circuit performance.

Selection of capacitors for power converters may also take into account such factors as capacitor component variations, reduced effective capacitance with DC bias, and ceramic capacitor temperature coefficients (minimum and maximum temperature operating limits, and capacitance variation with temperature).

Similarly, in various embodiments of power converters, it may be beneficial to use specific types of inductors. For example, it is generally useful for the inductors to have low DC equivalent resistance, high inductance, and small volume.

The controller(s) used to control startup and operation of a power converter may be implemented as a microprocessor, a microcontroller, a digital signal processor (DSP), register-transfer level (RTL) circuitry, and/or combinatorial logic.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A gate control circuit for controlling current flow through a power FET having a gate, the gate control circuit including:
   (a) a voltage control circuit including a first selectable configuration electrically disconnected from a node, and a second selectable configuration electrically coupled to the node, wherein the node has a first voltage in the first selectable configuration and a lower second voltage in the second selectable configuration; and
   (b) a voltage supply device having a gate coupled to the node and a conduction channel configured to be coupled to the gate of the power FET and to provide an output voltage to the gate of the power FET in response to the voltage at the node, wherein an ON resistance, $R_{ON}$, of the power FET in a first ON state is lowered when the voltage control circuit is in the first selectable configuration during normal operation of the power FET and current flow through the power FET in a second ON state is restricted when the voltage control circuit is in the second selectable configuration.

2. The invention of claim 1, wherein the gate control circuit is configured to restrict current flow through the power FET in the second ON state upon the occurrence of a potentially damaging event.

3. The invention of claim 2, wherein the power FET is part of a power converter, and the potentially damaging event results from a dynamic re-configuration of a conversion ratio of the power converter.

4. The invention of claim 2, wherein the power FET is part of a power converter, and the potentially damaging event results from startup of the power converter.

5. The invention of claim 2, wherein the power FET is part of a power converter, and the potentially damaging event results from charge re-balancing within the power converter.

6. A gate driver circuit for regulating an ON resistance, $R_{ON}$, of a power FET in a power converter circuit, the gate driver circuit including:
   (a) a current source coupled between a first voltage source and a node;
   (b) a voltage regulator coupled to the node and configured to provide a voltage at the node;
   (c) a voltage control circuit including a first selectable configuration electrically disconnected from the node, and a second selectable configuration electrically coupled to the node, wherein the voltage at the node when the voltage control circuit is in the first selectable configuration is higher than in the second selectable configuration; and
   (d) driving circuitry, coupled between the node and the gate of the power FET, for applying at least two selectable voltages to the gate of the power FET such that the $R_{ON}$ of the power FET is lower when the voltage control circuit is in the first selectable configuration than when the voltage control circuit is in the second selectable configuration.

7. The invention of claim 6, wherein the voltage control circuit includes:
   (a) a switch;
   (b) a first diode-connected FET; and
   (c) at least one additional diode-connected FET;
   wherein the switch, the first diode-connected FET, and the at least one additional diode-connected FET are coupled in series between the node of the gate driver circuit and a reference voltage.

8. The invention of claim 6, wherein the voltage regulator is a Zener diode.

9. The invention of claim 6, wherein the driving circuitry includes a plurality of series-coupled inverters coupled to the gate of the power FET.

10. A gate control circuit for a power FET in a power converter circuit, including:
   (a) a level shifter including an input configured to receive a control signal and output a voltage-shifted version of the control signal to control the power FET;
   (b) a gate driver circuit including:
      (1) a current source coupled between a first voltage source and a node;
      (2) a voltage regulator coupled to the node and configured to provide a voltage at the node;
      (3) a voltage control circuit including a first selectable configuration electrically disconnected from the node, and a second selectable configuration electrically coupled to the node which lowers the voltage at the node; and
      (4) a voltage supply circuit element coupled to the node and configured to provide an output voltage in response to the voltage at the node; and
   (c) a buffer circuit coupled to the output of the level shifter and to the output voltage from the voltage supply circuit element, the buffer circuit configured to be coupled to a gate of the power FET, wherein the buffer circuit provides a drive voltage to the gate of the power FET having a first voltage when the voltage control circuit is in the first selectable configuration and a second, lower voltage when the voltage control circuit is in the second selectable configuration.

11. The invention of claim 10, wherein the voltage control circuit includes:
   (a) a switch;
   (b) a first diode-connected FET; and
   (c) at least one additional diode-connected FET;
   wherein the switch, the first diode-connected FET, and the at least one additional diode-connected FET are coupled in series between the node of the gate driver circuit and a reference voltage.

12. The invention of claim 10, wherein the voltage regulator is a Zener diode.

13. The invention of claim 10, wherein the buffer circuit includes a plurality of series-coupled inverters.

\* \* \* \* \*